(12) United States Patent
Tada et al.

(10) Patent No.: US 6,734,624 B2
(45) Date of Patent: May 11, 2004

(54) ORGANIC ELECTRO-LUMINESCENCE DEVICE AND METHOD FOR FABRICATING SAME

(75) Inventors: Hiroshi Tada, Tokyo (JP); Atsushi Oda, Tokyo (JP); Hitoshi Ishikawa, Tokyo (JP); Satoru Toguchi, Tokyo (JP); Yukiko Morioka, Tokyo (JP)

(73) Assignee: NEC Corporation, Tokyo (JP)

( * ) Notice: Subject to any disclaimer, the term of this patent is extended or adjusted under 35 U.S.C. 154(b) by 439 days.

(21) Appl. No.: 09/731,700

(22) Filed: Dec. 8, 2000

(65) Prior Publication Data

US 2001/0019242 A1 Sep. 6, 2001

(30) Foreign Application Priority Data

Dec. 8, 1999 (JP) ............................... 11-348616
Jun. 22, 2000 (JP) ....................... 2000-187947

(51) Int. Cl.⁷ ................................. H01J 1/62
(52) U.S. Cl. ................ 313/506; 313/502; 313/503; 313/504
(58) Field of Search ................ 313/502, 503, 313/504, 506, 509, 112; 428/690

(56) References Cited

U.S. PATENT DOCUMENTS

| | | | | |
|---|---|---|---|---|
| 4,998,038 | A | * | 3/1991 | Watanabe et al. ............ 313/116 |
| 5,317,169 | A | * | 5/1994 | Nakano et al. ................ 257/40 |
| 5,928,802 | A | * | 7/1999 | Shi et al. ..................... 428/690 |
| 6,091,195 | A | * | 7/2000 | Forrest et al. ............... 313/504 |
| 6,396,208 | B1 | * | 5/2002 | Oda et al. .................... 313/504 |
| 6,447,934 | B1 | * | 9/2002 | Suzuki et al. ................ 428/690 |
| 6,469,439 | B2 | * | 10/2002 | Himeshima et al. ......... 313/506 |
| 6,476,550 | B1 | * | 11/2002 | Oda et al. .................... 313/504 |
| 6,497,969 | B2 | * | 12/2002 | Kim et al. .................... 428/690 |
| 6,586,119 | B1 | * | 7/2003 | Hashimoto et al. .......... 428/690 |
| 2002/0061418 | A1 | * | 5/2002 | Imanishi ....................... 428/690 |

FOREIGN PATENT DOCUMENTS

| | | |
|---|---|---|
| JP | 9268284 | 10/1977 |
| JP | A 59-65810 | 4/1984 |
| JP | 62172691 | 7/1987 |
| JP | 63264692 | 11/1988 |
| JP | 63314795 | 12/1988 |
| JP | 1220394 | 9/1989 |
| JP | 2247278 | 10/1990 |
| JP | 517765 | 1/1993 |
| JP | 570773 | 3/1993 |
| JP | 8298186 | 11/1996 |
| JP | 9157643 | 6/1997 |
| JP | 9268283 | 10/1997 |
| JP | 1072581 | 3/1998 |
| JP | A 10-77467 | 3/1998 |
| JP | A 10-167728 | 6/1998 |
| JP | A 10-270171 | 10/1998 |
| JP | A 10-270-172 | 10/1998 |
| JP | A 11-106935 | 4/1999 |
| JP | A 11-283751 | 10/1999 |
| JP | 11283751 | 10/1999 |
| JP | A 11-307266 | 11/1999 |
| JP | A 11-329740 | 11/1999 |
| JP | A 2000-503163 | 3/2000 |

* cited by examiner

Primary Examiner—David V. Bruce
Assistant Examiner—Jurie Yun
(74) Attorney, Agent, or Firm—Young & Thompson

(57) ABSTRACT

An organic EL device including a substrate, at least one organic thin-film layer overlying the main surface, and a pair of electrodes sandwiching therebetween the organic thin-film layer, at least one of the electrodes being a metallic electrode, the organic thin film layer defining a recombination electroluminescence region which is apart from the metallic electrode by at least 100 nm and has a periodic structure. In the organic EL device of the present invention, the emitted light is efficiently taken out by increasing the distance between the EL light-emitting region and the metal electrode for separating the light-emitting location from the metal electrode.

20 Claims, 5 Drawing Sheets

ORGANIC ELECTRO-LUMINESCENCE DEVICE AND METHOD FOR FABRICATING SAME

BACKGROUND OF THE INVENTION (a) Field of the Invention

The present invention relates to an organic electroluminescent (EL) device having an excellent luminescence property such as high efficient luminance and a method for fabricating the same.

(b) Description of the Related Art

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, 51, 913(1987) and the like), studies on an organic EL device have been briskly carried out. Tang et al. reported an organic EL device using tris(8-hydroxyquinolinol aluminum) in a light-emitting layer and a triphenyldiamine derivative to a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices However, in the organic EL device, the upper limit of a light-emitting probability exists because a probability of generating a singlet is restricted due to dependency on the spin statistics during the recombination of carriers. The upper limit is known to be about 25%. Further, in the organic EL device, light having an outgoing angle larger than the critical angle cannot be taken out because the light causes the total reflection due to the refractive index of the light-emitting member. When the refractive index of the light-emitting member is 1.6, only about 20% of the emitted light can be effectively utilized, and the upper limit of the total energy conversion efficiency including the singlet forming efficiency is forced to be about 5% (T. Tsutsui, "Current State and Tend of Organic Electro-Luminescence", Monthly Display, vol.1, No.3, p.11, September, 1995). Such the low efficiency of the light-taking-out is a significant problem in the organic EL device in which the light-emitting is strictly restricted.

A means for elevating the light-taking-out efficiency of light emitting devices such as an inorganic EL device having similar structure to that of the above EL device has been examined. For example, the means includes a method for elevating an efficiency by providing an ability of collecting light to a substrate (JP-A-63(1988)-314795) and a method for forming a reflection surface on a side surface of a device (JP-A-1(1989)-220394). These methods are effective for a device having a larger light-emitting surface area, but the formation of the lens having the ability of collecting light and the reflection surface on the side surface are hardly performed in a device having a small pixel area such as a dot matrix display. Since the film thickness of the light-emitting layer of the organic EL device is several $\mu$m or less, the formation of the reflection mirror having a tapered surface on the side surface of the device is difficult by using the current technique, and a high cost is required for performing the above formation. In another method in which a flattened layer having a refractive index between those of the substrate glass and the light-emitting layer is formed between the substrate glass and the light-emitting layer (JP-A-62 (1987)-172691), the forward light-taking-out efficiency is improved but the total reflection cannot prevented Accordingly, even if the method is efficient the inorganic EL device having the larger refractive index, the method cannot exert the larger improving effect on the organic EL device which has the relatively lower refractive index.

Accordingly, the taking-out of the light in the conventional organic EL device is insufficient, and the development of the method for taking out the light in the organic EL device is inevitable. An organic EL device is described in JP-A-11(1999)-283751 including diffraction gratings for improving the light-taking-out efficiency. According to the method, the light-emitting efficiency is elevated, however, the light-taking-out efficiency is not sufficiently elevated.

SUMMARY OF THE INVENTION

In view of the foregoing, an object of the present invention is to provide an organic EL device having a higher efficiency and a method for fabricating the same.

The present invention provides, in a first aspect thereof, an organic EL device including a substrate having a main surface, at least one organic thin-film layer overlying the main surface, and a pair of electrodes sandwiching therebetween the organic thin-film layer, at least one of the electrodes being a metallic electrode, the organic thin film layer defining a recombination electroluminescence region which is apart from the metallic electrode by at least 100 nm in a direction normal to the main surface, the organic EL device having a periodic structure in a direction parallel to the main surface.

In accordance with the first aspect of the present invention, the emitted light is efficiently taken out by increasing the distance between the EL light-emitting region and the metal electrode for separating the light-emitting location from the metal electrode.

The present invention provides, in a second aspect thereof, a method of forming an organic EL device, wherein the organic EL device comprising a substrate having a main surface, a layered structure overlying the main surface and including at least one organic thin-film layer and a refractive layer having a refractive index higher than a refractive index of the organic thin-film layer, and a pair of electrodes sandwiching therebetween the organic thin-film layer, at least one of the electrodes being a transparent electrode, the organic EL device having a periodic structure in a direction parallel to the main surface, and wherein the method comprising the steps of applying a coating solution wherein a precursor including metallic compound is dispersed, and curing the coated film to form the refractive layer.

In accordance with the second aspect of the present invention, the refractive layer having both of the appropriate thickness and the transparency can be fabricated at a reduced cost by applying a coating solution in which a precursor containing a metal compound is dispersed followed by solidifying.

The above and other objects, features and advantages of the present invention will be more apparent from the following description.

PREFERRED EMBODIMENTS OF THE INVENTION

Now, the present invention is more specifically described with reference to accompanying drawings.

Figure 1:
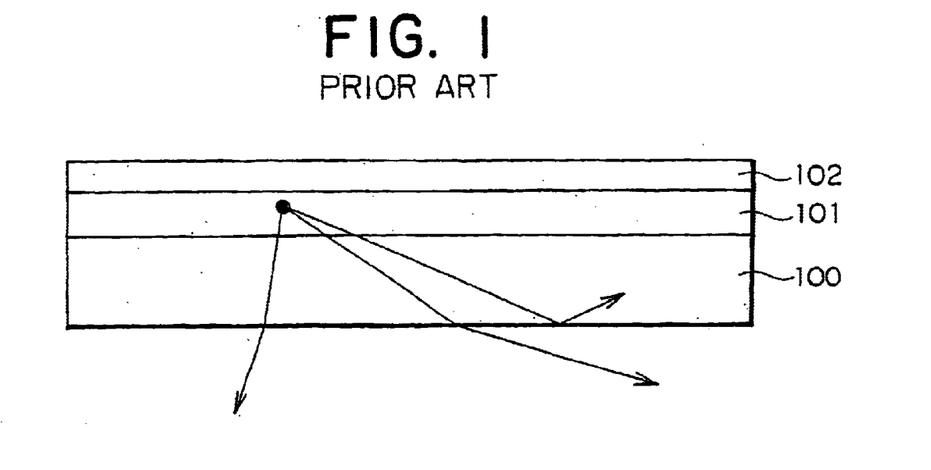
FIG. 1 is a vertical sectional view showing a conventional organic EL device.

As shown in FIG. 1, a conventional organic EL device has a structure including an organic thin-film layer 101 sandwiched by a pair of electrodes, that is, an anode (not shown) and a cathode 102 overlying an ITO (indium-tin oxide) substrate 100. Generally, one of the two electrodes is a transparent electrode made of ITO for taking out emitted light, and the other is a metal electrode. In this configuration, the emitted light suffers propagation loss from the metal electrode when the light propagates in the organic thin-film layer ("Photo-integrated Circuit" written by H. Nishihara et al, Ohm K. K.). This is because the metal acts as a dielectric having a negative dielectric constant and a large loss due to the inertia effect of a charge in the metal in a region of a light wavelength. While the emitted light component having an outgoing angle at nearly 0° is less affected by the influence of the propagation loss because the path near the metal electrode on which the component passes is shorter, the emitted light component having a larger outgoing angle is affected by the influence of the propagation loss because the path near the metal electrode on which the component passes is longer (FIG. 1). When the outgoing angle is larger than a specified angle, the light reflects at an interface with air and enclosed, in the EL device, thereby further increasing the influence of the propagation loss by the metal electrode.

The efficiency of taking-out of the emitted light component having the larger outgoing angle increases the taking-out efficiency of the light in the organic EL device. Accordingly, in the present invention, the emitted light is efficiently taken out by increasing the distance between the EL light-emitting region and the metal electrode for separating the light-emitting location from the metal electrode, and further by preferably providing a periodical structure parallel to the substrate. Thereby, especially, the emitted light component having the larger outgoing angle is efficiently taken out to elevate the light-taking-out efficiency. As a result of the diligent research, the present inventors have found that the efficient increase of the light-taking-out efficiency can be attained by separating the light-emitting region from the metal electrode by 100 nm or more.

Further in the present invention, a refractive layer having a refractive index higher than that of the organic thin-film layer is disposed in a position separated from the metal electrode, the taking-out efficiency of the light is increased because the emitted light propagating in the horizontal direction is concentrated into the refractive layer for reducing the influence of the loss of the propagation from the metal electrode.

When the refractive layer is formed, the light can be efficiently taken out by also separating the EL light-emitting region from the metal electrode, and further by preferably providing the periodical structure parallel to the substrate.

The refractive layer having the higher refractive index may be formed in the following manner. The thickness of the refractive layer is preferably 50 nm or more and more preferably 200 nm or more because the emitted light cannot be efficiently enclosed in the thinner refractive layer. The refractive index of the refractive layer is required to be higher than that of the organic thin-film layer, and is preferably 1.7 or more. The refractive layer is preferably transparent for reducing the loss by absorption.

Such the refractive layer having both of the appropriate thickness and the transparency is hardly fabricated by an ordinary vapor deposition method such as sputtering. In the vapor deposition method, the formation of the thicker layer lowers the uniformity and the transparency of the layer. Further in the vapor deposition method, the facility conducting the fabrication becomes larger to excessively increase the cost.

Accordingly, in the present invention, the refractive layer having the above properties can be fabricated at a reduced cost by applying a coating solution in which a precursor containing a metal compound is dispersed followed by solidifying. Concrete methods for fabricating the refractive layer include a sol-gel method, a thermally decomposition method and an organic acid salt method, and are not restricted thereto.

A known compound can be used as the precursor containing the metal compound, including a metal alkoxide, an organic acid salt, a metal complex and a metal oxide.

In the present invention, when solidifying and hardening the refractive layer or the film, the pattern of the substrate can be transferred to the layer by contacting the layer with the substrate having the periodical structure in contact with the layer (replica method). After the solidifying, the refractive layer having the periodical structure can be obtained by peeling off the substrate. Similarly, the refractive layer can be obtained when the substrate having the periodical structure and made of resin is used and, after the formation of the refractive layer having the periodical structure, the substrate is melted or dissolved in accordance with a thermal treatment or a solvent treatment, respectively.

A layer having a periodical structure formed by fine balls dispersed therein in contact with the refractive layer may be used. By suitably selecting the materials such that a difference of the refractive indexes is generated between the medium and the fine balls, the periodical structure having the proper refractive index distribution can be fabricated. In this case, one of the refractive indexes is higher than the other's. The preferable diameter of the fine balls for taking out the EL emitted light is effectively 50 nm to 5 μm.

The structure of the organic EL structure is a one-organic-layer structure or a multi-organic-layered structure, and examples thereof include a structure of anode/light-emitting layer/cathode, a structure of anode/hole-transport layer/light-emitting layer/electron transport-layer/cathode, a structure of anode/hole-transporting layer/light-emitting layer/cathode, and a structure of anode/light-emitting layer/electron-transporting layer/cathode.

In general, the anode is transparent and the cathode is made of a metal, and the distance between the light-emitting region and the cathode is increased. When an electron-transporting layer is inserted between the light-emitting layer and the cathode, the light-emitting region and the cathode are sufficiently separated by adjusting the thickness of the electron-transporting layer to be 100 nm or more. The electron-transporting layer may be formed as a double layered structure including a layer for blocking the holes and an exciton and a spacer layer for the electron-transporting or as a multi-layered structure having three or more layers. By using the spacer layer made of a highly conductive material, the distance between the light-emitting region and the cathode is increased without elevating a driving voltage of the device too high. In the case of the device structure of anode/hole-transporting layer/light-emitting layer/cathode, a material having the light-emitting ability and the electron-transporting ability is generally used as the light-emitting layer. In this instance, since the area near the hole-transporting layer in the light-emitting layer acts as the region for recombining the holes and the electrons and for emitting the light, the region for recombination and emitting is sufficiently separated from the cathode by thickening the light-emitting layer.

When the anode is the metal electrode, the light-emitting layer is separated from the anode. When a hole-transporting layer is inserted between the light-emitting layer and the anode, the light-emitting region and the anode are sufficiently separated by adjusting the thickness of the hole-transporting layer to be 100 nm or more. The hole-transporting layer may be formed as a double layered structure including a layer for blocking the electrons and an exciton and a spacer layer for the hole-transporting or as a multi-layered structure having three or more layers. By using the spacer layer made of a highly conductive material, the distance between the light-emitting region and the anode is increased without elevating a driving voltage of the device too high. In the case of the device structure of anode/light-emitting layer/electron-transporting layer/cathode, a material having the light-emitting ability and the hole-transporting ability is generally used as the light-emitting layer, In this instance, since the area near the electron-transporting layer in the light-emitting layer acts as the region for recombining the holes and the electrons and for emitting the light, the region for recombination and emitting is sufficiently separated from the anode by thickening the light-emitting layer.

The material for the hole-transporting used in the present invention is not especially restricted, and includes any compound ordinarily used. Concrete examples thereof include triphenyl diamines such as bis(di(p-tolyl) aminophenyl)-1,1-cyclohexane (Compound 01), N,N'-diphenyl-N,N'-bis(3-methylphenyl)-1,1'-biphenyl-4,4'-diamine (Compound 02) and N,N'-diphenyl-N-N-bis(1-naphtyl)-1,1'-biphenyl)-4,4'-diamine (Compound 03), star burst type compounds (Compounds 04 to 06), and conductive polymers such as poly-p-phenylenevinylene derivatives, polyaniline derivatives and polythiophene derivatives.

The conductive polymer is effective as the spacer layer having the hole-transporting ability. A mixed layer including a Lewis acid such as $FeCl_3$ and the hole-transporting material may be also used.

The electron-transporting material used in the present invention is not especially restricted, and includes any compound ordinarily used. Concrete examples thereof include oxadiazole derivatives such as 2-(4-biphenylyl)-5-(4-t-butylphenyl)-1,3,4-oxadiazole (Compound 07) and bis{2-(4-t-butylphenyl)-1,3,4-oxadiazole}-m-phenylene (Compound 08), triazole derivatives (Compounds 09 and 10), quinolinol-based metal complexes (Compounds 11 to 14), basophenanthroline (Compound 15) and basocuproine (Compound 16).

A mixed layer including the electron-transporting material and the metal is also effective as the electron-transporting spacer layer because the driving voltage is maintained to be low even when the thickness is increased. The electron-transporting material may be appropriately selected from known materials. The metal may be appropriately selected from known metals, and such metals having low ionization potential as Mg, Ca, Li, Cs and Al are preferably used for providing the electron-transporting ability.

The light-emitting material used in the present invention is not especially restricted, and includes any compound ordinarily used. Concrete examples thereof include distyrylarylene derivatives (JP-A-2(1990)-247278 and JP-A-5 (1993)-17765)), coumarin derivatives, dicyanomethylenepyran derivatives, perylene derivatives (JP-A-63(1988)-264692), aromatic materials (JP-A-8(1996)-298186 and JP-A-9(1997)-268284), anthracene-family derivatives (JP-A-9(1997)-157643, JP-A-9(1997)-268283 and JP-A-10 (1998)-72581), and quinacridone derivatives (JP-A-5 (1993)-70773).

The anode of the organic EL device injects the holes into the hole-transporting layer and preferably has a work function of 4.5 eV or more. Concrete examples of the anode material used in the present invention include indium-tin oxide (ITO), tin oxide (NESA) and gold.

The cathode of the organic EL device injects the electrons into the electron-transporting layer or the light-emitting layer and preferably has a smaller work function. Concrete examples of the cathode material used in the present invention include indium, aluminum, magnesium, a magnesium-indium alloy, a magnesium-aluminum alloy, an aluminum-lithium alloy, an aluminum-scandium-lithium alloy and a magnesium-silver alloy, and are not restricted thereto.

The respective layers of the organic EL device of the present invention are formed in accordance with any known method. For example, a vacuum vapor deposition method, a molecular beam epitaxy (MBE) method, a dipping method in which the EL device is dipped in a solution having a desired material, and an application method such as a spin coating method, a casting method and a bar-coating method and a roll-coating method.

EXAMPLES

Example 1

Figure 2:
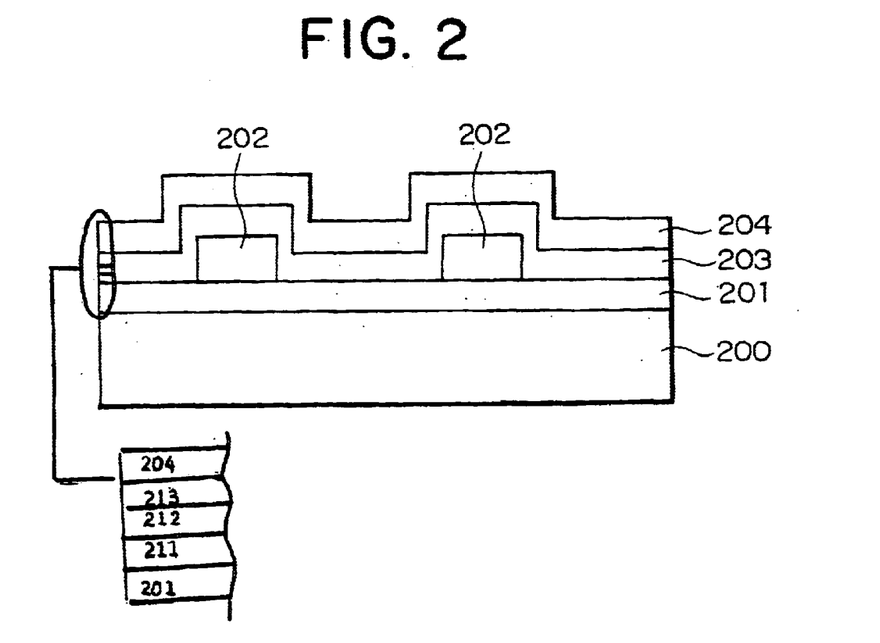
FIG. 2 is a vertical sectional view showing an organic EL device in accordance with an embodiment of the present invention.

An organic EL device shown in FIG. 2 was fabricated in accordance with the following procedures.

An ITO film was formed by means of sputtering on a glass substrate 200 such that a sheet resistance of the film was adjusted to be 20 Ω/□, thereby forming an anode 201. After a SiO film having a thickness of 50 nm was deposited thereon by means of a vacuum deposition method, a reactive gas etching was conducted to form diffraction gratings 202 made of the SiO. Each of the diffraction gratings has a pitch of 700 nm and a line-space ratio of 1:1.

Then, an organic thin-film layer 203 including the following three layers was formed thereon. A hole-transporting layer 211 made of the Compound 03 was deposited by the vacuum deposition method in a thickness of 50 nm. A light-emitting layer 212 made of the Compound 11 was deposited by the vacuum deposition method in the thickness of 60 nm on the hole-transporting layer. Then, an electron-transporting layer 213 made of the Compound 16 and magnesium was co-deposited by the vacuum deposition method in the thickness of 400 nm in a deposition rate of 2:1 on the light-emitting layer.

Then, a magnesium-silver alloy 214 was co-deposited by the vacuum deposition method in the thickness of 150 nm in a deposition rate of 10:1 to form a cathode 204, thereby fabricating an organic EL device.

When a current of 5 mA/cm$^2$ was applied on the device, emitted light of 372 cd/m$^2$ was obtained. The improvement of the light-emitting efficiency was confirmed when the efficiency was compared with that of Comparative Example described below.

Comparative Example

Figure 3:
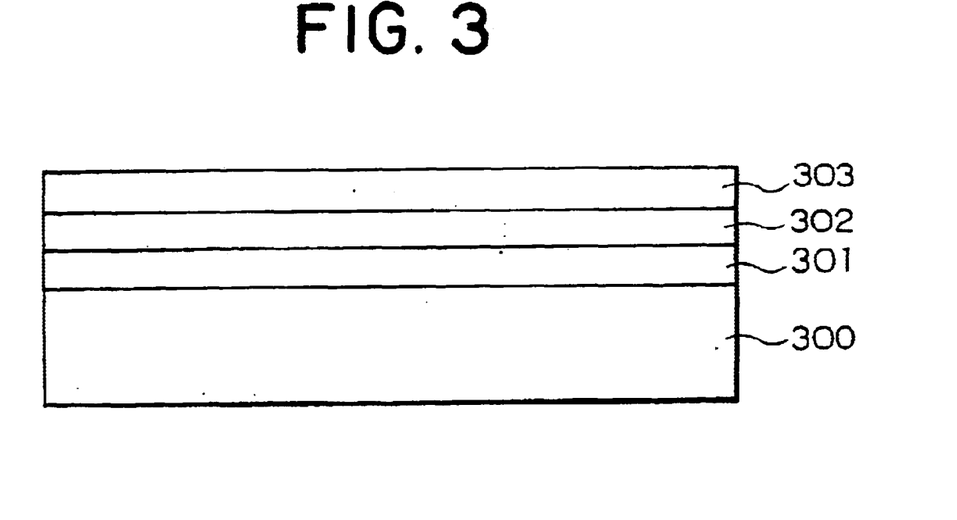
FIG. 3 is a vertical sectional view showing an organic EL device in accordance with Comparative Example.

An organic EL device shown in FIG. 3 was fabricated in accordance with the following procedures.

An ITO film was formed by means of sputtering on a glass substrate 300 such that a sheet resistance of the film was adjusted to be 20 Ω/□, thereby forming an anode 301.

Then, an organic thin-film layer 302 including the following three layers was formed thereon. A hole-transporting layer made of the Compound 03 was deposited by the vacuum deposition method in a thickness of 50 nm. A light-emitting layer made of the Compound 11 was deposited by the vacuum deposition method in the thickness of 60 nm on the hole-transporting layer. Then, an electron-transporting layer made of the Compound 16 and magnesium was co-deposited by the vacuum deposition method in the thickness of 400 nm in a deposition rate of 2:1 on the light-emitting layer.

Then, a magnesium-silver alloy was co-deposited by the vacuum deposition method in the thickness of 150 nm in a deposition rate of 10:1 to form a cathode 303, thereby fabricating an organic EL device.

When a current of 5 mA/cm$^2$ was applied on the device, emitted light of 143 cd/m$^2$ was obtained.

Examples 2 to 8

Organic EL devices were fabricated in accordance with the same procedure of Example 1 (FIG. 3) except that a thickness of each of the organic EL devices was adjusted as shown in Table 1.

When a current of 5 mA/cm$^2$ was applied on each of the devices, each of emitting brightness was shown in Table 1.

TABLE 1

| Example | Thickness of Electron-Transporting Layer | Emitting Brightness |
| --- | --- | --- |
| 2 | 50 nm | 168 cd/m$^2$ |
| 3 | 70 nm | 159 cd/m$^2$ |

TABLE 1-continued

| Example | Thickness of Electron-Transporting Layer | Emitting Brightness |
| --- | --- | --- |
| 4 | 100 nm | 312 cd/m$^2$ |
| 5 | 150 nm | 360 cd/m$^2$ |
| 6 | 200 nm | 405 cd/m$^2$ |
| 7 | 700 nm | 396 cd/m$^2$ |
| 8 | 1 μm | 381 cd/m$^2$ |

Example 9

Figure 4:
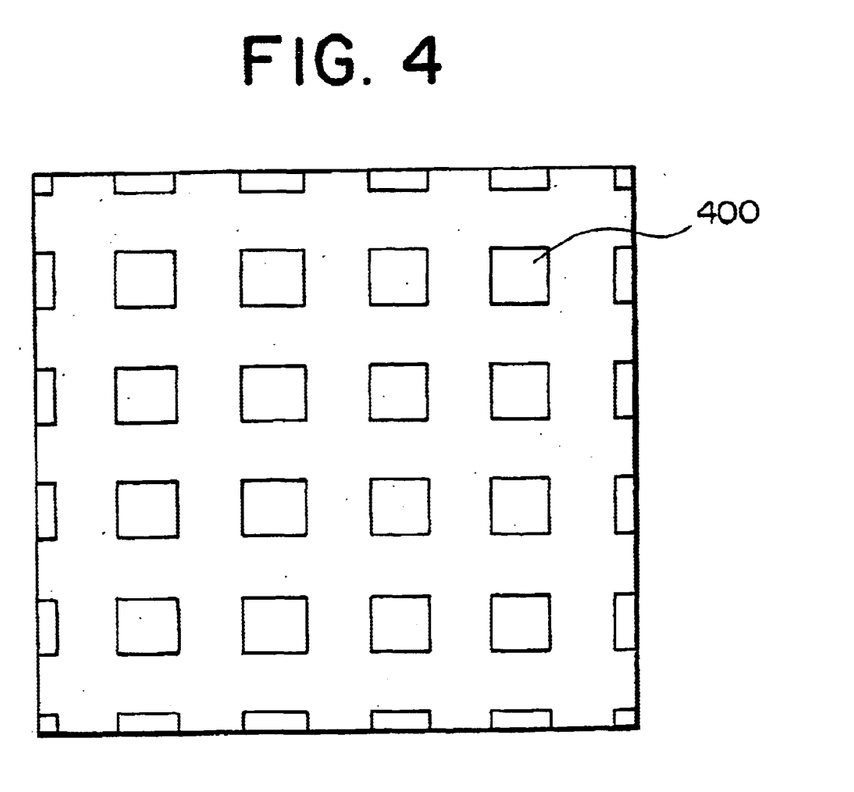
FIG. 4 shows an exemplified diffraction grating used in the organic EL device of the present invention.

An organic EL device having a two-dimensional diffraction grating as the SiO pattern shown in FIG. 4 was fabricated in accordance with procedures similar to those of Example 1. The SiO pattern included rectangular dots 400. The pitches of the two-dimensional diffraction grating in the directions of width and length were 700 nm, and the ratios between the lines and the spaces were 1:1. When a current of 5 mA/cm$^2$ was applied on the device, emitted light of 489 cd/m$^2$ was obtained.

Example 10

Figures 5, 6:
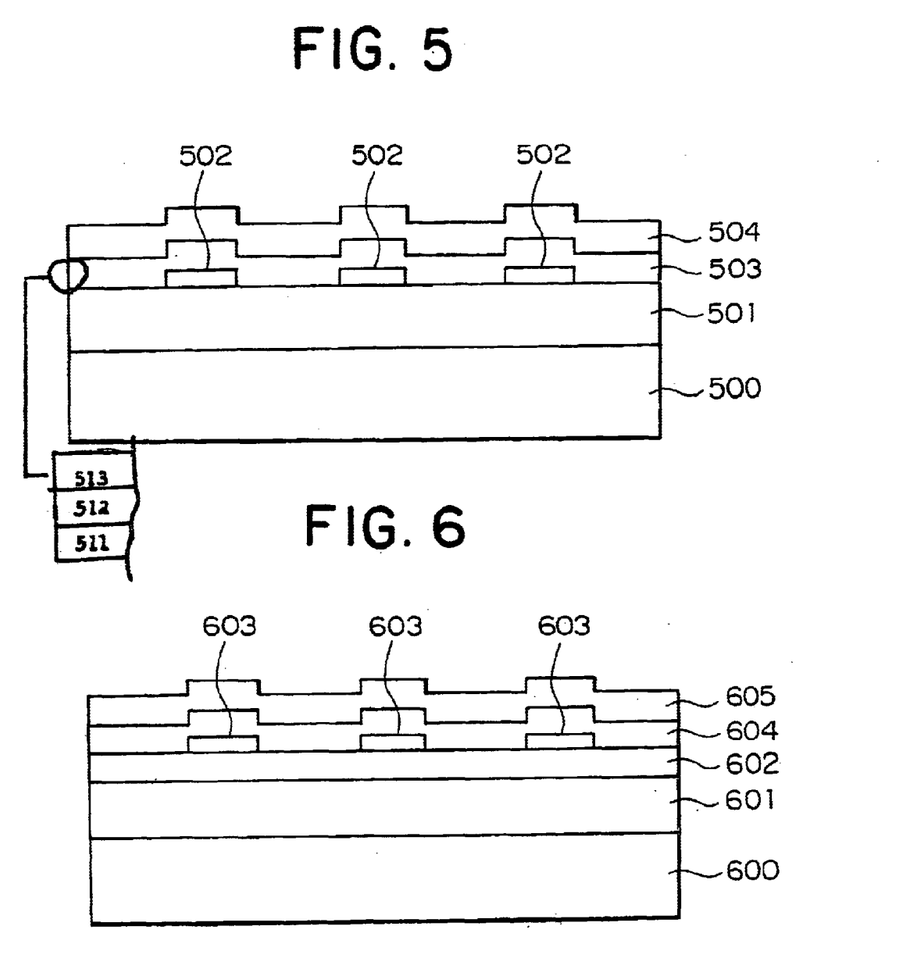
FIG. 5 is a vertical sectional view showing an organic EL device in accordance with another embodiment.
FIG. 6 is a vertical sectional view showing an organic EL device in accordance with a further embodiment.

An organic EL device shown in FIG. 5 was fabricated. Colloidal particles of indium hydroxide and anhydrous stannic chloride were dispersed in an indium chloride aqueous solution by using ultrasonic waves, and acetic acid and polyvinyl alcohol were added thereto to prepare a coating solution. After the coating solution was applied on a glass substrate 500 by dip coating, the substrate was thermally treated to form an ITO film 501 having a thickness of 1.3 μm acting as a refractive layer. After a SiO film having a thickness of 50 nm was deposited on the ITO film by means of a vacuum deposition method, diffractive gratings 502 made of the SiO were formed by means of the reactive gas etching. The pitch of the differential gratings was 700 nm, and the ratio between the line and the space was 1:1.

Then, an organic thin-film layer 503 including the following two layers was formed thereon. A hole-transporting layer 511 made of the Compound 03 was deposited by the vacuum deposition method in a thickness of 60 nm. A light-emitting layer 512 made of the Compound 11 was deposited by the vacuum deposition method in the thickness of 80 nm on the hole-transporting layer.

Then, a magnesium-silver alloy was co-deposited by the vacuum deposition method in the thickness of 150 nm in a deposition rate of 10:1 to form a cathode 504, thereby fabricating an organic EL device.

When a current of 5 mA/cm$^2$ was applied on the device, emitted light of 287 cd/m$^2$ was obtained.

Example 11

An organic EL device shown in FIG. 5 was fabricated. An ITO film and a SiO film similar to those of Example 10 were formed.

Then, an organic thin-film layer 503 including the following three layers was formed thereon. A hole-transporting layer 511 made of the Compound 03 was deposited by the vacuum deposition method in the thickness of 50 nm. A light-emitting layer 512 made of the Compound 11 was deposited by the vacuum deposition method in the thickness of 60 nm on the hole-transporting layer. Then, an electron-transporting layer 513 made of the Compound 16 and magnesium was co-deposited by the vacuum deposition method in the thickness of 400 nm in a deposition rate of 2:1 on the light-emitting layer.

Then, a magnesium-silver alloy was co-deposited by the vacuum deposition method in the thickness of 150 nm in a deposition rate of 10:1 to form a cathode 504, thereby fabricating an organic EL device.

When a current of 5 mA/cm$^2$ was applied on the device, emitted light of 368 cd/m$^2$ was obtained.

Example 12

An organic EL device shown in FIG. 5 was fabricated. Similarly to Example 10, a film made of ITO having the thickness of 1.3 μm was formed on the glass substrate 500, and then ITO was further deposited thereon by sputtering in the thickness of 80 nm to form an ITO film 501 acting as the refractive layer.

After a SiO film having a thickness of 50 nm was deposited the ITO film by means of a vacuum deposition method, diffractive gratings 502 made of the SiO were formed by means of the reactive gas etching. The pitch of the differential gratings was 700 nm, and the ratio between the line and the space was 1:1.

Then, an organic thin-film layer including the following three layers was formed thereon A hole-transporting layer made of the Compound 03 was deposited by the vacuum deposition method in a thickness of 50 nm. A light-emitting layer made of the Compound 11 was deposited by the vacuum deposition method in the thickness of 60 nm on the hole-transporting layer. Then, an electron-transporting layer made of the Compound 16 and magnesium was co-deposited by the vacuum deposition method in the thickness of 400 nm in the deposition rate of 2:1 on the light-emitting layer.

Then, a magnesium-silver alloy was co-deposited by the vacuum deposition method in the thickness of 150 nm in a deposition rate of 10:1 to form a cathode 504, thereby fabricating an organic EL device.

When a current of 5 mA/cm$^2$ was applied on the device, emitted light of 418 cd/m$^2$ was obtained.

Example 13

An organic EL device shown in FIG. 6 was fabricated. Transparent sol (coating solution) was prepared by diluting Ti(i-OC$_3$H$_7$)$_4$ with anhydrous ethanol and adding dropwise a hydrochloric acid solution diluted with anhydrous ethanol thereto under stirring, The prepared transparent sol was dip-coated on a glass substrate 600 which was then thermally treated for forming a preliminary titanium oxide film thereon. The procedures were repeated 10 times to form the titanium oxide film 601 having a thickness of 0.9 μm acting as the refractive layer.

Then, an ITO film was formed by means of sputtering thereon such that a sheet resistance of the film was adjusted to be 20 Ω/□, thereby forming an anode 602. After a SiO film having a thickness of 50 nm was deposited thereon by means of a vacuum deposition method, a reactive gas etching was conducted to form diffraction gratings 603 made of the SiO. Each of the diffraction gratings has a pitch of 700 nm and a line-space ratio of 1.1.

Then, an organic thin-film layer 604 including the following three layers was formed thereon. A hole-transporting layer made of the Compound 03 was deposited by the vacuum deposition method in a thickness of 50 nm. A light-emitting layer made of the Compound 11 was deposited by the vacuum deposition method in the thickness of 60 nm on the hole-transporting layer. Then, an electron-transporting layer made of the Compound 16 and magnesium was co-deposited by the vacuum deposition method in the thickness of 400 nm in the deposition rate of 2:1 on the light-emitting layer.

Then, a magnesium-silver alloy was co-deposited by the vacuum deposition method in the thickness of 150 nm in a deposition rate of 10:1 to form a cathode 605, thereby fabricating an organic EL device.

When a current of 5 mA/cm$^2$ was applied on the device, emitted light of 431 cd/m$^2$ was obtained.

Example 14

Figure 7:
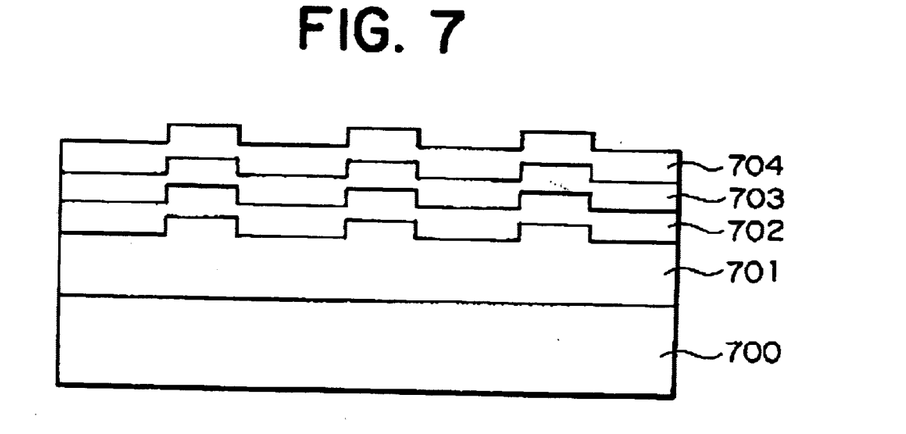
FIG. 7 is a vertical sectional view showing an organic EL device in accordance with a still further embodiment.
Figure 8:
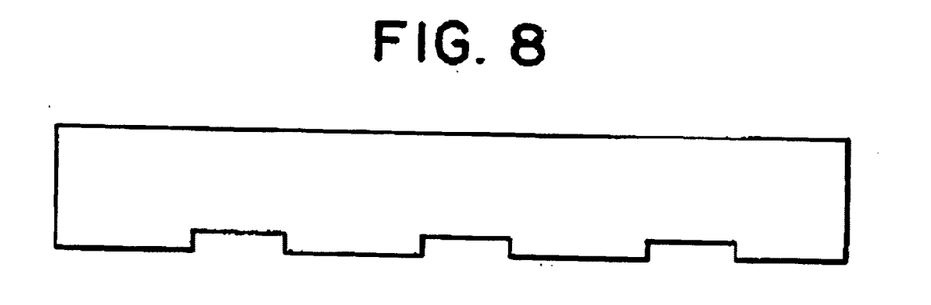
FIG. 8 is a vertical sectional view showing an example of a substrate having a periodical structure used in a replica method.

An organic EL device shown in FIG. 7 was fabricated. Similarly to Example 13, a titanium oxide film having a thickness of 0.9 μm was deposited on a glass substrate 700. However, in the final coating step, the thermal treatment was conducted while a silicon substrate was pressed to the coating surface, The silicon substrate had thereon a diffraction grating pattern shown in FIG. 8 having a pitch of 800 nm, a line-space ratio of 1:1 and a depth of 50 nm. The silicon substrate having the pattern was separated from the glass substrate, thereby forming a titanium oxide layer 701 having the transferred pattern.

Then, an ITO film was formed by means of sputtering thereon such that a sheet resistance of the film was adjusted to be 20 Ω/□, thereby forming an anode 702.

Then, an organic thin-film layer 703 including the following three layers was formed thereon. A hole-transporting layer made of the Compound 03 was deposited by the vacuum deposition method in a thickness of 50 nm. A light-emitting layer made of the Compound 11 was deposited by the vacuum deposition method in the thickness of 60 nm on the hole-transporting layer. Then, an electron-transporting layer made of the Compound 16 and magnesium was co-deposited by the vacuum deposition method in the thickness of 400 nm in the deposition rate of 2:1 on the light-emitting layer.

Then, a magnesium-silver alloy was co-deposited by the vacuum deposition method in the thickness of 150 nm in a deposition rate of 10:1 to form a cathode 704, thereby fabricating an organic EL device.

When a current of 5 mA/cm$^2$ was applied on the device, emitted light of 399 cd/m$^2$ was obtained.

Example 15

Figure 9:
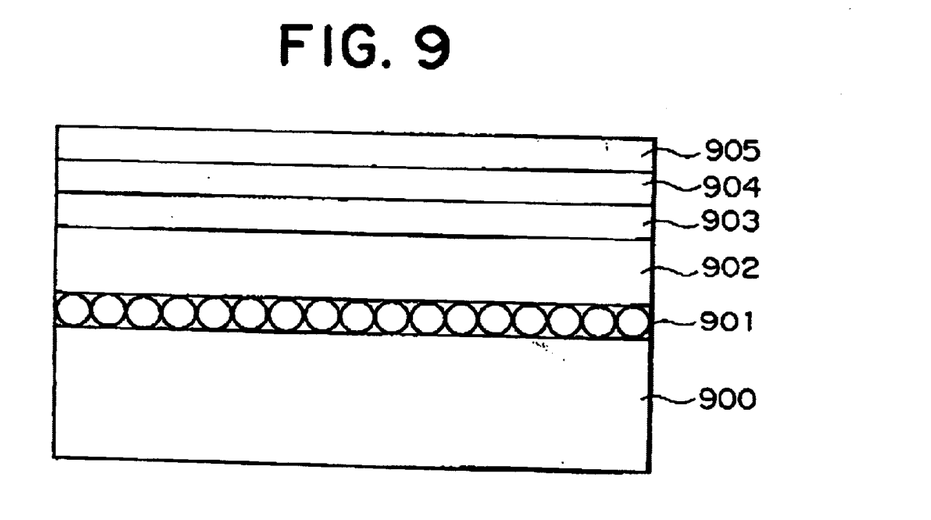
FIG. 9 is a vertical sectional view showing an organic EL device in accordance with a still further embodiment.

An organic EL device shown in FIG. 9 was fabricated. Transparent sol (coating solution) was prepared by diluting Ti(i-OC$_3$H$_7$)$_4$ with anhydrous ethanol and adding dropwise a hydrochloric acid solution diluted with anhydrous ethanol thereto under stirring. After fine balls of SiO$_2$ having an average particle diameter of 280 nm were dispersed therein, the solution was dip-coated on a glass substrate 900 which was then thermally treated for forming a titanium oxide film 901 having the dispersed SiO$_2$ fine balls. Then, similarly to Example 13, a titanium oxide film 902 having a thickness of 0.9 μm acting as the refractive layer was formed thereon.

Then, an ITO film was formed by means of sputtering thereon such that a sheet resistance of the film was adjusted to be 20 Ω/□, thereby forming an anode 903.

Then, an organic thin-film layer including the following three layers was formed thereon. A hole-transporting layer made of the Compound 03 was deposited by the vacuum deposition method in a thickness of 50 nm. A light-emitting layer made of the Compound 11 was deposited by the vacuum deposition method in the thickness of 60 nm on the hole-transporting layer. Then, an electron-transporting layer made of the Compound 16 and magnesium was co-deposited by the vacuum deposition method in the thickness of 400 nm in the deposition rate of 2:1 on the light-emitting layer.

Then, a magnesium-silver alloy was co-deposited by the vacuum deposition method in the thickness of 150 nm in a deposition rate of 10:1 to form a cathode 905, thereby fabricating an organic EL device.

When a current of 5 mA/cm$^2$ was applied on the device, emitted light of 391 cd/m$^2$ was obtained.

Example 16

Figure 10:
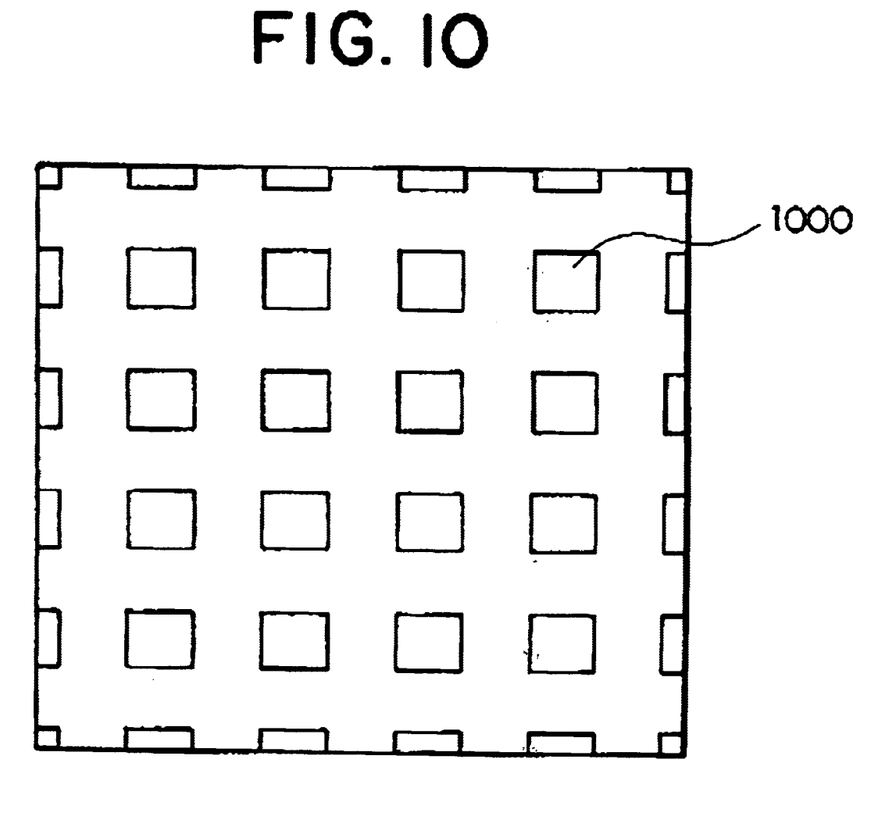
FIG. 10 shows another exemplified diffraction grating used in the organic EL device of the present invention.

An organic EL device having a two-dimensional diffraction grating as the SiO pattern shown in FIG. 10 was fabricated in accordance with procedures similar to those of Example 13. The SiO pattern included rectangular dots 1000. The pitches of the two-dimensional diffraction grating in the directions of width and length were 700 nm, and the ratios between the lines and the spaces were 1:1. When a current of 5 mA/cm$^2$ was applied on the device, emitted light of 445 cd/m$^2$ was obtained.

Since the above embodiments are described only for examples, the present invention is not limited to the above embodiments and various modifications or alternations can be easily made therefrom by those skilled in the art without departing from the scope of the present invention.

What is claimed is:

1. An organic electroluminesent (EL) device, comprising:
   a substrate having a main surface;
   at least one organic thin-film layer overlying the main surface, the organic thin-film layer being one of a single layer and of a plurality of layers;
   a pair of electrodes sandwiching therebetween the organic thin-film layer, at least one of the electrodes being a transparent electrode;
   a refractive layer having a refractive index higher than a refractive index of the organic thin-film layer; and
   a fine ball layer disposed in contact with the refractive layer and comprising fine balls dispersed therein,
   the fine ball layer having a refraction index different from the refractive index of the refractive layer.

2. The organic electroluminescent (EL) device of claim 1, wherein said refractive layer is interposed between said transparent electrode and said substrate.

3. The organic electroluminescent (EL) device of claim 2, wherein,
   the pair of electrodes include the transparent electrode and a metallic electrode,
   the organic thin film layer defines a recombination electroluminescence layer separated from said metallic electrode by at least 100 nm in a direction normal to the main surface.

4. The organic electroluminescent (EL) device of claim 3, wherein the recombination electroluminescence layer in said organic thin film layer is separated from said metallic electrode by at least 150 nm in a direction normal to the main surface.

5. The electroluminescent (EL) device of claim 2, wherein,
   said fine ball layer is a coated layer of a metallic compound with fine balls dispersed therein; and
   said refractive layer is a coated layer of the metallic compound.

6. The organic electroluminescent (EL) device of claim 5, wherein a diameter of said fine balls is between 50 nm and 50 μm.

7. The organic electroluminescent (EL) device of claim 2, wherein a diameter of said fine balls is between 50 nm and 50 μm.

8. The electroluminescent (EL) device of claim 1, wherein,
   said fine ball layer is a coated layer of a metallic compound with fine balls dispersed therein; and
   said refractive layer is a coated metallic layer.

9. The organic electroluminescent (EL) device of claim 8, wherein a diameter of said fine balls is between 50 nm and 50 μm.

10. The organic electroluminescent (EL) device of claim 1, wherein a diameter of said fine balls is between 50 nm and 50 μm.

11. The organic electroluminescent (EL) device of claim 1, wherein,
    the pair of electrodes include the transparent electrode and a metallic electrode,
    the organic thin film layer defines a recombination electroluminescence layer separated from said metallic electrode by at least 100 nm in a direction normal to the main surface.

12. The organic electroluminescent (EL) device of claim 11, wherein the recombination electroluminescence layer in said organic thin film layer is separated from said metallic electrode by at least 150 nm in a direction normal to the main surface.

13. An organic electroluminescent (EL) device, comprising:
    a substrate having a main surface;
    at least one organic thin-film layer overlying the main surface, the organic thin-film layer being one of a single layer and of a plurality of layers;
    a pair of electrodes sandwiching therebetween the organic thin-film layer, at least one of the electrodes being a transparent electrode;
    said transparent electrode including a refractive layer having a refractive index higher than a refractive index of the organic thin-film layer; and
    a fine ball layer disposed in contact with the refractive layer and having fine balls dispersed therein,
    the fine ball layer having a refraction index different from the refractive index of the refractive layer.

14. The organic electroluminescent (EL) device of claim 13, wherein a diameter of said fine balls is between 50 nm and 50 μm.

15. The organic electroluminescent (EL) device of claim 13, wherein,
    the pair of electrodes include the transparent electrode and a metallic electrode,
    the organic thin film layer defines a recombination electroluminescence layer separated from said metallic electrode by at least 100 nm in a direction normal to the main surface.

16. The organic electroluminescent (EL) device of claim 15, wherein the recombination electroluminescence layer in said organic thin film layer is separated from said metallic electrode by at least 150 nm in a direction normal to the main surface.

17. An organic electroluminescent (EL) device, comprising:

a substrate having an upper main surface;

a first electrode overlying the upper main surface;

a organic thin film layer comprising a light-emitting recombination electroluminescence layer overlying the first electrode; and a second electrode overlying the electron-transporting layer, one of the first and second electrodes being a metallic electrode, the light-emitting layer recombination electroluminescence region being vertically separated apart from the metallic electrode by at least 150 nm in a direction normal to the upper main surface.

18. The device of claim 17, further comprising plural structures arranged periodic in a direction parallel to the main surface and located intermediate the first and second electrodes.

19. The device of claim 18, wherein the plural structures arranged periodic in the direction parallel to the main surface comprise rectangular dots.

20. The device of claim 19, wherein the rectangular dots are arranged with spaces therebetween and a pitch, a width and a length of the dots provide a 1:1 ratio between lines of dots and spaces.

* * * * *